(12) United States Patent
Inaba et al.

(10) Patent No.: US 12,721,085 B2
(45) Date of Patent: Aug. 25, 2026

(54) SUBSTRATE TREATMENT DEVICE AND SUBSTRATE TREATMENT METHOD

(71) Applicant: SCREEN Holdings Co., Ltd., Kyoto (JP)

(72) Inventors: Masaki Inaba, Kyoto (JP); Naoko Arima, Kyoto (JP); Kei Suzuki, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 218 days.

(21) Appl. No.: 18/551,049

(22) PCT Filed: Mar. 9, 2022

(86) PCT No.: PCT/JP2022/010397
§ 371 (c)(1),
(2) Date: Sep. 18, 2023

(87) PCT Pub. No.: WO2022/202340
PCT Pub. Date: Sep. 29, 2022

(65) Prior Publication Data

US 2024/0162060 A1 May 16, 2024

(30) Foreign Application Priority Data

Mar. 25, 2021 (JP) ................................ 2021-052417

(51) Int. Cl.
*H10P 72/00* (2026.01)
*B01F 23/237* (2022.01)
(Continued)

(52) U.S. Cl.
CPC .. *H10P 72/0422* (2026.01); *B01F 23/237613* (2022.01); *B01F 23/711* (2022.01);
(Continued)

(58) Field of Classification Search
CPC ......... H01L 21/67075; H01L 21/30604; B01F 35/2215; B01F 23/711; B01F 23/237613;
(Continued)

(56) References Cited

U.S. PATENT DOCUMENTS

2003/0051742 A1 3/2003 Boyers ........................... 134/30
2005/0026435 A1 2/2005 Chen et al. .................. 438/689
(Continued)

FOREIGN PATENT DOCUMENTS

CN 103765561 A 4/2014
EP 1481741 B1 * 10/2010 .............. B08B 7/00
(Continued)

OTHER PUBLICATIONS

KR20070066323A—machine translation (Year: 2007).*
(Continued)

*Primary Examiner* — Tinsae B Ayalew
(74) *Attorney, Agent, or Firm* — OSTROLENK FABER LLP

(57) ABSTRACT

A substrate treatment apparatus includes: a substrate treatment unit that treats a substrate with a treatment liquid containing ozone dissolved therein; a recovery tank in which the treatment liquid discharged from the substrate treatment unit is recovered; a recovery pipe that connects the substrate treatment unit to the recovery tank; a heating member that heats the treatment liquid to a first temperature in at least one of the recovery pipe and the recovery tank; a supply piping system that supplies the treatment liquid from the recovery tank to the substrate treatment unit; and an ozone gas pipe that supplies ozone gas to the supply piping system to mix the ozone gas in the treatment liquid passing through the supply piping system.

1 Claim, 12 Drawing Sheets

(51) Int. Cl.

| | |
|---|---|
| ***B01F 23/70*** | (2022.01) |
| ***B01F 35/221*** | (2022.01) |
| ***C09K 13/04*** | (2006.01) |
| ***H10P 50/64*** | (2026.01) |
| *B01F 101/58* | (2022.01) |

(52) U.S. Cl.
CPC .......... *B01F 35/2215* (2022.01); *C09K 13/04* (2013.01); *H10P 50/642* (2026.01); *B01F 2101/58* (2022.01); *B01F 2215/0472* (2013.01)

(58) Field of Classification Search
CPC ......... B01F 2101/58; B01F 2215/0472; C09K 13/04
USPC .......................................................... 134/105
See application file for complete search history.

(56) References Cited

U.S. PATENT DOCUMENTS

| | | | | |
|---|---|---|---|---|
| 2008/0006295 | A1 | 1/2008 | Miyazaki et al. | |
| 2014/0045339 | A1 | 2/2014 | Iwata et al. | |
| 2014/0116464 | A1 | 5/2014 | Nagai et al. | 134/3 |

FOREIGN PATENT DOCUMENTS

| | | | | | |
|---|---|---|---|---|---|
| JP | 2006024793 | A | * | 1/2006 | |
| JP | 2008-016620 | A | | 1/2008 | |
| JP | 2010-021335 | A | | 1/2010 | |
| JP | 2012-204546 | A | | 10/2012 | |
| JP | 2014-036101 | A | | 2/2014 | |
| KR | 20070066323 | A | * | 6/2007 | H01L 21/67057 |
| KR | 10-2014-0036277 | A | | 3/2014 | |
| KR | 10-2020-0125137 | A | | 11/2020 | |

OTHER PUBLICATIONS

JP2006024793A—machine translation (Year: 2006).*
EP1481741B1—machine translation (Year: 2010).*
International Preliminary Report on Patentability (Chapter I) mailed Oct. 5, 2023 with a Notification from the International Bureau (Form PCT/IB/326) in corresponding PCT International Application No. PCT/JP2022/010397 in Japanese.
English translation of the International Preliminary Report on Patentability (Chapter I) mailed Oct. 5, 2023 in corresponding PCT International Application No. PCT/JP2022/010397 with a Notification from the International Bureau (Form PCT/IB/338).
International Search Report mailed Apr. 19, 2022 in corresponding PCT International Application No. PCT/JP2022/010397.

* cited by examiner

O3 gas
H2SO4
Exhaust
Exhaust
Drain
1
2
3
4
4a
5
6
7
10
11
12
13
14
15
16
17
18
18a
19
19
20
20A
20B
21
22
23
24
25
25A
25B
26
27
30
31
32
32a
32b
33
34
35
36
37
38
39
40
41
50
51
60
70
71
75
80
81
A1
W
SP 1
8
Controller
Rotative drive member
16
Nozzle movement mechanism
20
Heaters
23, 26, 50
Thermometers
27, 51
8A
CPU
Pumps
34, 36, 91, 98
Valves
21, 35, 37, 38, 39, 40, 41, 71, 81, 92, 93, 94, 97, 99
Memory
8B
Ozone concentration meter
25
Cooler
52

O3 gas
H2SO4
Detected concentration > Threshold
Exhaust
Drain
Exhaust
1
2
3
4
4a
5
6
7
10
11
12
13
14
15
16
17
18
18a
19
20
20A
20B
21
22
23
24
25
25A
25B
26
27
30
31
32
32a
32b
33
34
35
36
37
38
39
40
41
50
51
60
70
71
75
80
81
A1
SP
W O3 gas
H2SO4
Detected concentration ≦ Threshold
Exhaust
Exhaust
Drain
1
2
3
4
4a
5
6
7
10
11
12
13
14
15
16
17
18
18a
19
20
20A
20B
21
22
23
24
25
25A
25B
26
27
30
31
32
32a
32b
33
34
35
36
37
38
39
40
41
50
51
60
70
71
75
80
81
A1
SP
W O3 gas
H2SO4
Exhaust
Drain
Exhaust

SUBSTRATE TREATMENT DEVICE AND SUBSTRATE TREATMENT METHOD

CROSS-REFERENCE TO RELATED APPLICATIONS

The present application is a 35 U.S.C. §§ 371 national stage application of International Application No. PCT/JP2022/010397 filed Mar. 9, 2022, which claims priority to Japanese Patent Application No. 2021-052417, filed Mar. 25, 2021, the contents of which are incorporated herein by reference.

TECHNICAL FIELD

The present invention relates to a substrate treatment apparatus for treatment of a substrate, and a substrate treatment method for treatment of a substrate.

Exemplary substrates to be treated include semiconductor wafers, substrates for FPDs (Flat Panel Displays) such as liquid crystal display devices and organic EL (electroluminescence) display devices, substrates for optical disks, substrates for magnetic disks, substrates for magneto-optical disks, substrates for photomasks, ceramic substrates, and substrates for solar cells.

BACKGROUND ART

PTL 1 discloses a substrate treatment apparatus adapted to remove a resist from a substrate with the use of sulfuric acid containing fine ozone gas bubbles mixed therein. In the substrate treatment apparatus of PTL 1, the concentration of the sulfuric acid is measured after the removal of the resist from the substrate, and it is determined whether or not the sulfuric acid can be reused.

CITATION LIST

Patent Literature

PTL 1: JP 2010-21335A

SUMMARY OF INVENTION

Problems to be Solved by Invention

In the substrate treatment apparatus of PTL 1, the concentration of ozone remaining in the sulfuric acid is not adjusted for the reuse of the sulfuric acid. Therefore, if the ozone remains in the sulfuric acid to be reused, the ozone concentration of the sulfuric acid to be supplied to a substrate is liable to be higher than that intended, because ozone gas is further mixed in the sulfuric acid for the reuse.

It is an object of the present invention to provide a substrate treatment apparatus and a substrate treatment method which are adapted to treat a substrate with a treatment liquid containing ozone gas dissolved therein and are capable of reusing the treatment liquid while adjusting the ozone concentration of the treatment liquid.

Solution to Problem

According to one embodiment of the present invention, a substrate treatment apparatus is provided, which includes a substrate treatment unit that treats a substrate with a treatment liquid containing ozone dissolved therein; a recovery tank in which the treatment liquid discharged from the substrate treatment unit is recovered; a recovery pipe that connects the substrate treatment unit to the recovery tank; a heating member that heats the treatment liquid to a first temperature in at least one of the recovery pipe and the recovery tank; a supply piping system that supplies the treatment liquid from the recovery tank to the substrate treatment unit; and an ozone gas pipe that supplies ozone gas to the supply piping system to mix the ozone gas in the treatment liquid passing through the supply piping system.

In the substrate treatment apparatus, the treatment liquid used for the substrate treatment is heated to the first temperature in at least one of the recovery pipe and the recovery tank. Therefore, ozone contained in the treatment liquid is released in the form of ozone gas, so that the ozone concentration of the treatment liquid is reduced.

The supply piping system supplies the treatment liquid from the recovery tank to the substrate treatment unit. The ozone gas supplied from the ozone gas pipe to the supply piping system is mixed in the treatment liquid passing through the supply piping system before the treatment liquid is supplied to the substrate treatment unit. Therefore, the ozone gas is dissolved in the treatment liquid, so that the treatment liquid is supplied to the substrate treatment unit after the ozone concentration thereof is sufficiently increased.

As described above, ozone is intentionally removed from the treatment liquid used for the substrate treatment, and then the ozone gas is dissolved in the resulting treatment liquid. Thus, the treatment liquid can be reused for the substrate treatment. This makes it possible to reuse the treatment liquid while adjusting the ozone concentration of the treatment liquid.

In an embodiment of the present invention, the substrate treatment apparatus further includes a temperature adjustment member that adjusts the temperature of the treatment liquid passing through the supply piping system to a second temperature lower than the first temperature.

In the substrate treatment apparatus, the temperature of the treatment liquid passing through the supply piping system is adjusted to the second temperature (e.g., not lower than 80° C. and not higher than 130° C.) that is lower than the first temperature (e.g., not lower than 150° C. and not higher than 200° C.) of the treatment liquid in the recovery tank. That is, the treatment liquid is heated to the first temperature so as to sufficiently reduce the ozone concentration of the treatment liquid, and then the temperature of the treatment liquid is adjusted to the second temperature. The ozone gas supplied from the ozone gas pipe to the supply piping system is mixed in the treatment liquid having a sufficiently reduced temperature, whereby the ozone gas can be dissolved in the treatment liquid. This makes it possible to sufficiently remove ozone from the treatment liquid and then increase again the ozone concentration of the treatment liquid. Thus, the ozone concentration of the treatment liquid to be supplied from the supply piping system to the substrate treatment unit can be precisely adjusted.

In an embodiment of the present invention, the temperature adjustment member is provided upstream of the ozone gas pipe in the supply piping system. Therefore, the temperature of the treatment liquid is adjusted to the second temperature before the ozone gas supplied from the ozone gas pipe to the supply piping system is mixed in the treatment liquid. Thus, the ozone gas supplied to the supply piping system can be speedily dissolved in the treatment liquid.

In an embodiment of the present invention, the treatment liquid is a sulfuric acid-containing liquid that contains sulfuric acid. Where the treatment liquid is the sulfuric acid-containing liquid, a sulfuric acid/ozone mixture liquid (SOM liquid) that is suitable for a resist removing process can be prepared by dissolving the ozone gas in the sulfuric acid-containing liquid. Where the substrate includes a silicon layer having a major surface and a resist layer formed on a protection region of the major surface of the silicon layer, for example, the resist layer can be removed by supplying the SOM liquid to the substrate.

If the ozone concentration of the SOM liquid is excessively high when the resist layer is removed with the use of the SOM liquid, a surface portion of the major surface of the silicon layer other than the protection region is liable to be oxidized to be unintentionally formed with an oxide layer.

Where ozone is intentionally removed from the sulfuric acid-containing liquid used for the resist removing process of the substrate and then the ozone gas is dissolved in the resulting sulfuric acid-containing liquid, the sulfuric acid-containing liquid can be reused for the resist removing process. This makes it possible to suppress the unintended oxidation of the surface portion of the silicon layer.

In an embodiment of the present invention, the supply piping system includes: a storage tank that stores the treatment liquid; an upstream supply pipe that feeds the treatment liquid from the recovery tank to the storage tank; and a downstream supply pipe that is connected to the ozone gas pipe and supplies the treatment liquid from the storage tank toward the substrate treatment unit.

In the substrate treatment apparatus, the treatment liquid heated in at least one of the recovery pipe and the recovery tank to thereby have a reduced ozone concentration can be stored in the storage tank. The treatment liquid is supplied from the storage tank toward the substrate treatment unit through the downstream supply pipe. Since the ozone gas pipe is connected to the downstream supply pipe, the ozone gas is mixed in the treatment liquid immediately before the treatment liquid is supplied to the substrate treatment unit. This suppresses reduction in the ozone concentration of the treatment liquid, which may otherwise occur due to the release of the ozone gas from the treatment liquid before the treatment liquid is supplied to the substrate treatment unit after the ozone gas is mixed in the treatment liquid. Thus, the ozone concentration of the treatment liquid to be supplied to the substrate treatment unit from the supply piping system can be precisely adjusted.

In an embodiment of the present invention, the substrate treatment apparatus further includes an ozone concentration meter that detects the ozone concentration of the treatment liquid in the recovery tank or an ozone concentration in a space contacting the liquid surface of the treatment liquid in the recovery tank.

In the substrate treatment apparatus, the ozone concentration of the treatment liquid in the recovery tank is directly or indirectly detected by the ozone concentration meter. This makes it possible to determine whether or not the ozone gas is sufficiently removed from the treatment liquid in the recovery tank by the heating by means of the heating member.

In an embodiment of the present invention, the substrate treatment apparatus further includes a switch valve that switches on and off the flow of the treatment liquid from the recovery tank to the supply piping system, and a controller that controls the switch valve based on the detection result of the ozone concentration meter. The controller opens the switch valve if the concentration detected by the ozone concentration meter is not higher than a predetermined threshold, and closes the switch valve if the detected concentration is higher than the predetermined threshold.

In the substrate treatment apparatus, the switch valve is closed to prevent the flow of the treatment liquid from the recovery tank to the supply piping system if the ozone concentration is higher than the threshold. If the ozone concentration is not higher than the threshold, the switch valve is opened to permit the flow of the treatment liquid into the supply piping system. Therefore, the treatment liquid is automatically allowed to flow into the supply piping system only when having an ozone concentration not higher than the threshold. Therefore, the ozone concentration of the treatment liquid can be more precisely adjusted in the supply piping system.

In a second embodiment of the present invention, a substrate treatment method is provided, which includes: a supply step of supplying a treatment liquid from a supply piping system to a substrate treatment unit in which a substrate is treated with a treatment liquid containing ozone dissolved therein; a recovery step of recovering the treatment liquid in a recovery tank from the substrate treatment unit through a recovery pipe; a heating step of heating the treatment liquid in at least one of the recovery tank and the recovery pipe so that the temperature of the treatment liquid in the recovery tank is adjusted to a first temperature; a liquid feeding step of feeding the treatment liquid heated in the heating step to the supply piping system; a temperature adjustment step of adjusting the temperature of the treatment liquid to a second temperature lower than the first temperature in the supply piping system; and an ozone gas mixing step of mixing ozone gas in the treatment liquid temperature-adjusted by the temperature adjustment step in the supply piping system.

The substrate treatment method provides the same effects as in the aforementioned embodiment.

In the second embodiment of the present invention, the first temperature may be not lower than 150° C. and not higher than 200° C., and the second temperature may be not lower than 80° C. and not higher than 130° C.

In the second embodiment of the present invention, the treatment liquid may be a sulfuric acid-containing liquid that contains sulfuric acid.

The above and other objects, features, and effects of the present invention will become more apparent from the following detailed description of the preferred embodiments with reference to the attached drawings.

DESCRIPTION OF EMBODIMENTS

<Structure of Substrate Treatment Apparatus>

Figure 1:
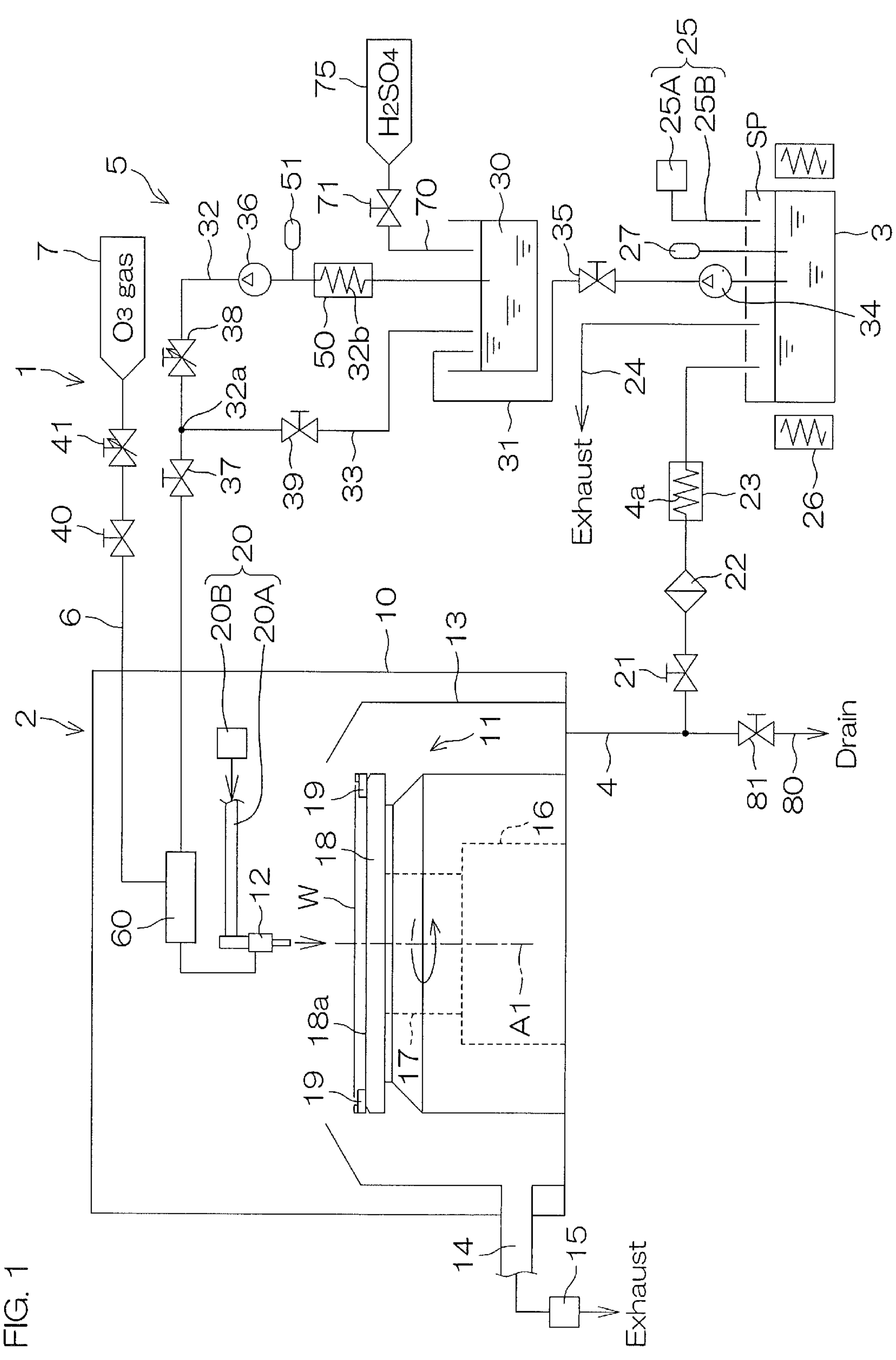
FIG. 1 is a schematic diagram showing the overall structure of a substrate treatment apparatus according to one embodiment of the present invention.

FIG. 1 is a schematic diagram showing the overall structure of a substrate treatment apparatus 1 according to one embodiment of the present invention.

The substrate treatment apparatus 1 is of single substrate treatment type adapted to treat disk-shaped substrates W such as semiconductor wafers one by one. In this embodiment, the substrate treatment apparatus 1 is configured to perform a resist removing process to lift off a resist layer 103 (see FIG. 4A to be described later) from the upper surface (upper major surface) of a substrate W with the use of a sulfuric acid/ozone mixture liquid (SOM liquid) which is a mixture liquid containing sulfuric acid and ozone gas.

The substrate treatment apparatus 1 includes: a substrate treatment unit 2 that treats the substrate W with a sulfuric acid-containing liquid (treatment liquid) containing ozone gas dissolved therein; a recovery tank 3 in which the sulfuric acid-containing liquid is recovered from the substrate treatment unit 2; a recovery pipe 4 that connects the substrate treatment unit 2 to the recovery tank 3; a supply piping system 5 that supplies the sulfuric acid-containing liquid from the recovery tank 3 to the substrate treatment unit 2; an ozone gas pipe 6 that supplies ozone gas to the supply piping system 5 to mix the ozone gas in the sulfuric acid-containing liquid passing through the supply piping system 5; an ozone gas generator 7 that is connected to the ozone gas pipe 6 and generates ozone gas; and a controller 8 (see FIG. 2 to be described later) that controls the components of the substrate treatment apparatus 1.

The substrate treatment unit 2 includes: a box-shaped chamber 10 having an inside space; a spin chuck 11 (rotating/holding member) that holds a single substrate W in a horizontal attitude in the chamber 10 and rotates the substrate W about a vertical rotation axis A1 extending through the center of the substrate W; a sulfuric acid-containing liquid nozzle 12 that supplies the sulfuric acid-containing liquid to the upper surface of the substrate W held by the spin chuck 11; and a tubular treatment cup 13 that surrounds the spin chuck 11. The sulfuric acid-containing liquid is a liquid containing sulfuric acid, for example, a sulfuric acid aqueous solution such as concentrated sulfuric acid.

An air supply unit (not shown) that supplies clean air is provided in the upper wall of the chamber 10. An exhaust device (not shown) is connected to the treatment cup 13 through an exhaust duct 14. The exhaust device sucks gas from the inside of the treatment cup 13 through the bottom of the treatment cup 13. The exhaust duct 14 is provided with an ozone eliminator 15 that decomposes ozone in the gas sucked by the exhaust device.

A chuck of clamp type that horizontally clamps the substrate W to horizontally hold the substrate W is used as the spin chuck 11. Specifically, the spin chuck 11 includes: a rotative drive member 16 such as a spin motor; a spin shaft 17 that is driven by the rotative drive member 16; and a disk-shaped spin base 18 generally horizontally attached to the upper end of the spin shaft 17.

The spin base 18 has a horizontal round upper surface 18*a* having an outer diameter that is greater than the outer diameter of the substrate W. A plurality of clamp members 19 (not less than three clamp members 19, e.g., six clamp members 19) are disposed on a peripheral portion of the upper surface 18*a*. The plural clamp members 19 are spaced a proper distance from each other circumferentially of the spin base 18 on the upper surface peripheral portion of the spin base 18 in conformity with the outer periphery of the substrate W.

The sulfuric acid-containing liquid nozzle 12 is, for example, a straight nozzle that spouts the sulfuric acid-containing liquid in the form of continuous stream. The sulfuric acid-containing liquid nozzle 12 is moved horizontally by a nozzle movement mechanism 20. The nozzle movement mechanism 20 includes a nozzle arm 20A having a distal end to which the sulfuric acid-containing liquid nozzle 12 is attached, and an arm movement mechanism 20B that moves the nozzle arm 20A to horizontally move the sulfuric acid-containing liquid nozzle 12. For example, the sulfuric acid-containing liquid nozzle 12 is attached to the nozzle arm 20A in a vertical attitude so as to spout the sulfuric acid-containing liquid perpendicularly to the upper surface of the substrate W. The nozzle arm 20A extends horizontally. The arm movement mechanism 20B includes an actuator such as an electric motor or an air cylinder.

The upstream end of the recovery pipe 4 is connected to the treatment cup 13 of the substrate treatment unit 2, and the downstream end of the recovery pipe 4 is connected to the recovery tank 3. The downstream end of the recovery pipe 4 is located above the liquid surface of the sulfuric acid-containing liquid in the recovery tank 3. The recovery tank 3 has an inside space SP contacting the liquid surface of the sulfuric acid-containing liquid in the recovery tank 3.

The substrate treatment apparatus 1 further includes: a recovery valve 21 that opens and closes the recovery pipe 4; a recovery filter 22 that removes impurity from the sulfuric acid-containing liquid passing through the recovery pipe 4; a recovery pipe heater 23 that heats the sulfuric acid-containing liquid in the recovery pipe 4; an exhaust pipe 24 through which the inside space SP of the recovery tank 3 is evacuated; an ozone concentration meter 25 that measures the ozone concentration in the inside space SP of the recovery tank 3; a recovery tank heater 26 that heats the sulfuric acid-containing liquid in the recovery tank 3; and a recovery side thermometer 27 that measures the temperature of the sulfuric acid-containing liquid in the recovery tank 3.

The recovery valve 21 is provided in the recovery pipe 4. The recovery filter 22 is provided downstream of the recovery valve 21 in the recovery pipe 4. A position (recovery heating position 4*a*) at which the liquid is heated by the recovery pipe heater 23 in the recovery pipe 4 is located downstream of the recovery filter 22.

Though not shown, the recovery valve 21 includes: a valve body having an inside flow path through which the liquid flows and an annular valve seat surrounding the inside flow path; a valve element movable with respect to the valve seat; and an actuator that moves the valve element between a closed position with the valve element in contact with the valve seat and an open position with the valve element apart from the valve seat. Other valves to be described below each have the same structure as the recovery valve 21.

The recovery pipe heater 23 heats the sulfuric acid-containing liquid passing through the recovery heating position 4*a*, for example, by externally heating the recovery pipe 4 at the recovery heating position 4*a*. The recovery tank heater 26 may be, for example, a heater attached to the outer surface of the wall of the recovery tank 3 as shown in FIG. 1. Although the recovery tank heater 26 is attached to the outer surface of the side wall of the recovery tank 3 in FIG. 1, the recovery tank heater 26 may be attached to the lower surface of the bottom wall of the recovery tank 3, or may be attached to both the bottom wall and the side wall. Unlike in FIG. 1, the recovery tank heater 26 may be a heater adapted to be immersed in the sulfuric acid-containing liquid in the recovery tank 3. The recovery pipe heater 23 and the recovery tank heater 26 are examples of the heating member. The recovery pipe heater 23 and the recovery tank heater 26 are each sometimes referred to herein as recovery side heater.

The recovery tank 3 is a closed-top tank, and the inside space SP of the recovery tank 3 is connected to the outside via the exhaust pipe 24. The ozone concentration meter 25 includes, for example, a meter body 25A, and a gas supply pipe 25B having a distal end located in the inside space SP of the recovery tank 3 to supply the gas from the inside space SP of the recovery tank 3 to the meter body 25A.

The sulfuric acid-containing liquid discharged from the substrate treatment unit 2 is heated by the recovery pipe heater 23 and the recovery tank heater 26. Therefore, the temperature of the sulfuric acid-containing liquid in the recovery tank 3 is kept at a first temperature. The first temperature is, for example, not lower than 150° C. and not higher than 200° C. The recovery tank heater 26 is not necessarily required to be constantly on, but may be switched between a heating state and a non-heating state based on the temperature measured by the recovery side thermometer 27.

The supply piping system 5 includes: a storage tank 30 that stores the sulfuric acid-containing liquid; an upstream supply pipe 31 that supplies the sulfuric acid-containing liquid from the recovery tank 3 to the storage tank 30; a downstream supply pipe 32 that is connected to the ozone gas pipe 6 and supplies the sulfuric acid-containing liquid from the storage tank 30 toward the substrate treatment unit 2; and a circulation pipe 33 that feeds back the sulfuric acid-containing liquid from the downstream supply pipe 32 to the storage tank 30 to thereby circulate the sulfuric acid-containing liquid from the storage tank 30. The circulation pipe 33 is branched from the downstream supply pipe 32.

The upstream end of the upstream supply pipe 31 is connected to the recovery tank 3, and the downstream end of the upstream supply pipe 31 is connected to the storage tank 30. The upstream end of the downstream supply pipe 32 is connected to the storage tank 30, and the downstream end of the downstream supply pipe 32 is connected to the sulfuric acid-containing liquid nozzle 12 of the substrate treatment unit 2. The upstream end of the circulation pipe 33 is connected to the downstream supply pipe 32, and the downstream end of the circulation pipe 33 is connected to the storage tank 30.

The substrate treatment apparatus 1 further includes: an upstream liquid feed pump 34 that feeds the sulfuric acid-containing liquid from the recovery tank 3 to the upstream supply pipe 31; an upstream supply valve 35 that opens and closes the upstream supply pipe 31; an upstream supply pump 36 that feeds the sulfuric acid-containing liquid from the storage tank 30 to the downstream supply pipe 32; a downstream supply valve 37 that opens and closes the downstream supply pipe 32; a downstream supply flow rate adjustment valve 38 that adjusts the flow rate of the sulfuric acid-containing liquid in the downstream supply pipe 32; and a circulation valve 39 provided in the circulation pipe 33 to open and close the circulation pipe 33.

The upstream liquid feed pump 34 is provided in the upstream supply pipe 31. The pump is a device that sucks liquid and discharges the sucked liquid. Other pumps to be described below each have the same structure as the upstream liquid feed pump 34.

The upstream supply valve 35 is provided downstream of the upstream liquid feed pump 34 in the upstream supply pipe 31. The upstream supply valve 35 is an example of the switch valve that switches on and off the supply of the sulfuric acid-containing liquid to the supply piping system 5.

The upstream supply pump 36 is provided in the downstream supply pipe 32. The downstream supply flow rate adjustment valve 38 is provided downstream of the upstream supply pump 36 and upstream of the connection position (circulation connection position 32*a*) of the circulation pipe 33 in the downstream supply pipe 32. The downstream supply valve 37 is provided downstream of the circulation connection position 32*a* in the downstream supply pipe 32.

The substrate treatment apparatus 1 further includes: an ozone gas valve 40 that opens and closes the ozone gas pipe 6; and an ozone gas flow rate adjustment valve 41 that adjusts the flow rate of the ozone gas in the ozone gas pipe 6.

The ozone gas flow rate adjustment valve 41 is provided in the ozone gas pipe 6. The ozone gas valve 40 is provided downstream of the ozone gas flow rate adjustment valve 41 in the ozone gas pipe 6.

The substrate treatment apparatus 1 further includes: a supply side heater 50 provided as the temperature adjustment member that adjusts the temperature of the sulfuric acid-containing liquid passing through the supply piping system 5 to a second temperature; and a supply side thermometer 51 that measures the temperature of the sulfuric acid-containing liquid in the supply piping system 5. The second temperature is a temperature lower than the first temperature and, for example, not lower than 80° C. and not higher than 130° C.

The supply side heater 50 is not necessarily required to be constantly on, but may be switched between a heating state and a non-heating state based on the temperature measured by the supply side thermometer 51. Since the second temperature is lower than the first temperature, the temperature of the sulfuric acid-containing liquid in the supply piping system 5 can be easily reduced to be adjusted to the second temperature by switching the supply side heater 50 from the heating state to the non-heating state.

In this embodiment, the supply side heater 50 heats the sulfuric acid-containing liquid in the downstream supply pipe 32. A position (supply heating position 32*b*) at which the liquid is heated by the supply side heater 50 in the downstream supply pipe 32 is located upstream of the upstream supply pump 36 in the downstream supply pipe 32.

The supply side heater 50 heats the sulfuric acid-containing liquid passing through the supply heating position 32*b*, for example, by externally heating the downstream supply pipe 32 at the supply heating position 32*b*. Unlike in this embodiment, the supply side heater 50 may be a heater adapted to be immersed in the sulfuric acid-containing liquid in the storage tank 30 to heat the sulfuric acid-containing liquid in the storage tank 30, or may be a heater attached to at least one of the outer surface of the side wall or the lower surface of the bottom wall of the storage tank 30. The supply side heater 50 may be a heater adapted to heat the sulfuric acid-containing liquid in the circulation pipe 33. Further, the supply side heater 50 may include any combination of these heaters as the temperature adjustment member.

The substrate treatment apparatus 1 further includes: a fluid mixer 60 provided in a junction between the downstream supply pipe 32 and the ozone gas pipe 6; a replenishment pipe 70 that supplies a fresh sulfuric acid-containing liquid (fresh liquid) to the storage tank 30 from a sulfuric acid-containing liquid supply source 75; and a drain pipe 80 connected to the recovery pipe 4 to drain the sulfuric acid-containing liquid from the recovery pipe 4 to the outside of the substrate treatment apparatus 1. The fluid mixer 60 is, for example, a stationary mixer that mixes the ozone gas in the sulfuric acid-containing liquid by stirring. The fluid mixer 60 is provided downstream of the downstream supply valve 37 in the downstream supply pipe 32.

The substrate treatment apparatus 1 further includes: a replenishment valve 71 provided in the replenishment pipe 70 to open and close the replenishment pipe 70; and a drain valve 81 provided in the drain pipe 80 to open and close the drain pipe 80. The drain pipe 80 is connected to the recovery pipe 4 upstream of the recovery valve 21.

Figure 2:
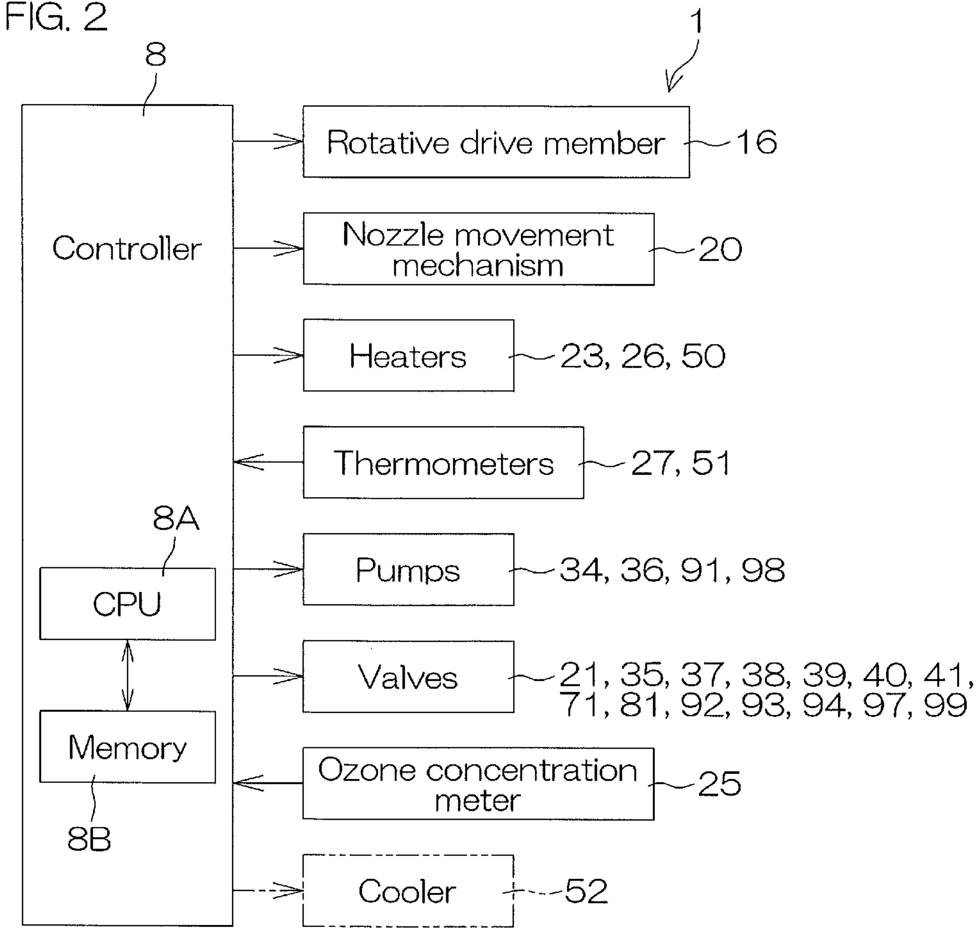
FIG. 2 is a block diagram for describing an exemplary configuration associated with the control of the substrate treatment apparatus.

FIG. 2 is a block diagram for describing an exemplary configuration associated with the control of the substrate treatment apparatus 1. The controller 8 includes a microcomputer, and is configured to control the to-be-controlled components of the substrate treatment apparatus 1 according to a predetermined control program.

Specifically, the controller 8 includes a processor (CPU) 8A, and a memory 8B storing the control program. The controller 8 is configured so that the processor 8A executes the control program to perform various control operations for the substrate treatment.

Particularly, the controller 8 is programmed so as to control the rotative drive member 16, the nozzle movement mechanism 20, the recovery pipe heater 23, the recovery tank heater 26, the supply side heater 50, the recovery side thermometer 27, the supply side thermometer 51, the ozone concentration meter 25, the upstream liquid feed pump 34, the upstream supply pump 36, the recovery valve 21, the upstream supply valve 35, the downstream supply valve 37, the downstream supply flow rate adjustment valve 38, the circulation valve 39, the ozone gas valve 40, the ozone gas flow rate adjustment valve 41, the replenishment valve 71, the drain valve 81, the ozone concentration meter 25, and the like.

In addition, the controller 8 controls the operations of the components of substrate treatment apparatuses 1 according to modifications to be described below.

<Exemplary Operations of Substrate Treatment Apparatus>

Figure 3A:
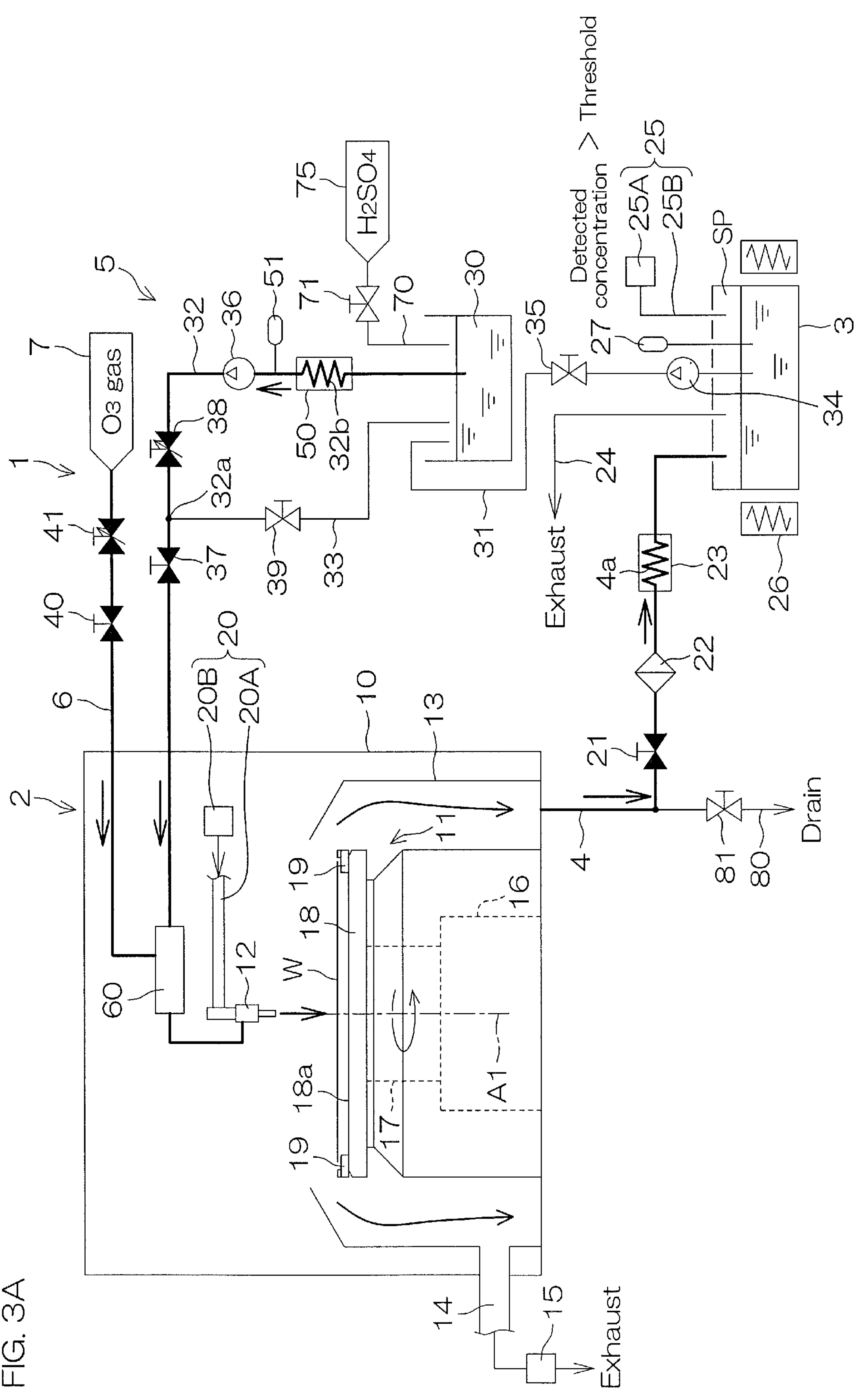
FIG. 3A is a schematic diagram for describing exemplary operations of the substrate treatment apparatus.
Figure 3B:
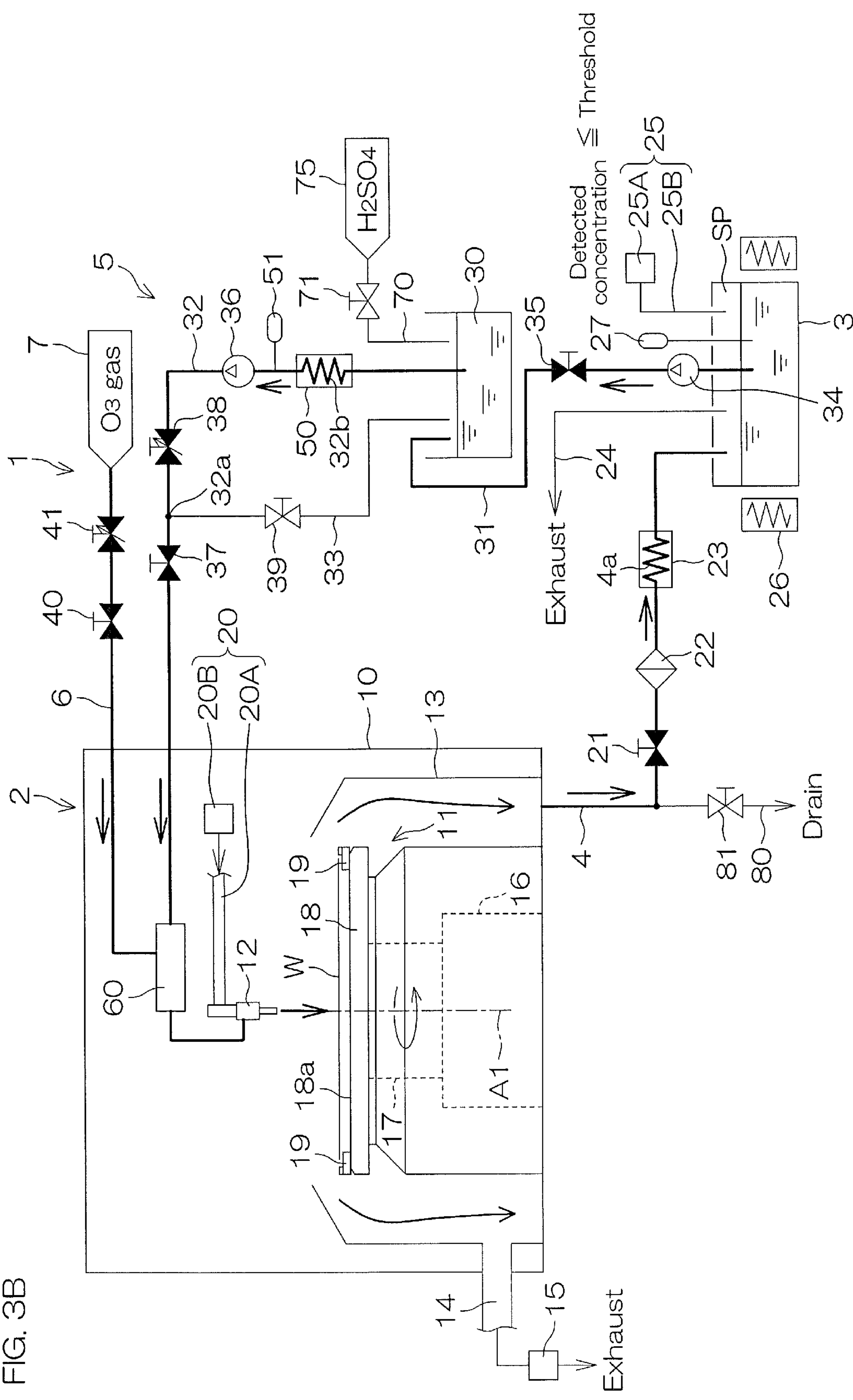
FIG. 3B is a schematic diagram for describing exemplary operations of the substrate treatment apparatus.

Next, exemplary operations to be performed by the substrate treatment apparatus 1 will be described. FIGS. 3A and 3B are schematic diagrams for describing the exemplary operations of the substrate treatment apparatus 1.

First, a substrate W is loaded into the chamber 10, and is held by the spin chuck 11 (substrate holding step). Then, as shown in FIG. 3A, the substrate W is rotated by the spin chuck 11 (substrate rotating step), and the sulfuric acid-containing liquid nozzle 12 is located at a treatment position. The treatment position is, for example, such that the sulfuric acid-containing liquid is applied to the center region of the upper surface of the substrate W. With the sulfuric acid-containing liquid nozzle 12 located at the treatment position, the ozone gas valve 40 and the downstream supply valve 37 are opened. With the ozone gas valve 40 and the downstream supply valve 37 thus opened, the sulfuric acid-containing liquid and the ozone gas are mixed together in the fluid mixer 60 (ozone gas mixing step).

With the sulfuric acid-containing liquid and the ozone gas thus mixed together in the fluid mixer 60, the ozone gas is dissolved in the sulfuric acid-containing liquid. The SOM liquid thus prepared in the fluid mixer 60 is spouted from the sulfuric acid-containing liquid nozzle 12 to be supplied to the upper surface of the rotating substrate W (supply step). That is, the sulfuric acid-containing liquid containing ozone dissolved therein is supplied from the supply piping system 5 to the substrate treatment unit 2.

As will be described later in detail, the resist layer 103 (see FIG. 4A to be described later) is dissolved to be removed from the substrate W by supplying the sulfuric acid-containing liquid containing the ozone gas dissolved therein to the upper surface of the substrate W.

While the sulfuric acid-containing liquid is supplied to the upper surface of the substrate W, the recovery valve 21 is kept open. The sulfuric acid-containing liquid supplied to the upper surface of the substrate W is scattered outward of the substrate W by a centrifugal force occurring due to the rotation of the substrate W, and received by the treatment cup 13. The sulfuric acid-containing liquid received by the treatment cup 13 is recovered in the recovery tank 3 via the recovery pipe 4 (recovery step).

The sulfuric acid-containing liquid containing ozone dissolved therein is heated by the recovery pipe heater 23 when passing through the recovery pipe 4. The sulfuric acid-containing liquid recovered in the recovery tank 3 is heated by the recovery tank heater 26. Thus, the temperature of the liquid in the recovery tank 3 is heated to the first temperature. With the sulfuric acid-containing liquid thus heated, the ozone dissolved in the sulfuric acid-containing liquid is released in the form of ozone gas from the sulfuric acid-containing liquid, whereby the ozone concentration of the sulfuric acid-containing liquid is reduced. In this manner, the sulfuric acid-containing liquid is heated in the recovery tank 3 and the recovery pipe 4 so that the temperature of the sulfuric acid-containing liquid in the recovery tank 3 is adjusted to the first temperature (heating step).

The ozone gas is released from the sulfuric acid-containing liquid, whereby the ozone concentration in the inside space SP of the recovery tank 3 is increased. On the other hand, the ozone gas is expelled from the inside space SP via the exhaust pipe 24, whereby the ozone concentration in the inside space SP is reduced. Where the concentration detected by the ozone concentration meter 25 is lower than a threshold, this means that the amount of the ozone gas present in the inside space SP is sufficiently reduced, and that the amount of the ozone dissolved in the sulfuric acid-containing liquid in the recovery tank 3 is sufficiently reduced. Therefore, the controller 8 controls the upstream supply valve 35 based on the detection result (detected concentration) of the ozone concentration meter 25.

Specifically, the controller 8 closes the upstream supply valve 35 if the concentration detected by the ozone concentration meter 25 is higher than the predetermined threshold, and opens the upstream supply valve 35 if the concentration detected by the ozone concentration meter 25 is not higher than the predetermined threshold. Therefore, if a heating temperature, a heating period or the like for the heating of the sulfuric acid-containing liquid is insufficient, the upstream supply valve 35 is closed as shown in FIG. 3A. It is expected that the heating temperature, the heating period and/or the like for the heating of the sulfuric acid-containing liquid may be insufficient immediately after the recovery of the sulfuric acid-containing liquid is started or when a greater amount of the sulfuric acid-containing liquid is recovered.

If the sulfuric acid-containing liquid is sufficiently heated and the ozone is sufficiently removed from the sulfuric acid-containing liquid, the upstream supply valve 35 is opened as shown in FIG. 3B. With the upstream supply valve 35 thus opened, the sulfuric acid-containing liquid is fed from the recovery tank 3 to the supply piping system 5 (liquid feeding step). Specifically, the sulfuric acid-containing liquid is fed from the recovery tank 3 to the storage tank 30 through the upstream supply pipe 31. The sulfuric acid-containing liquid flowing into the supply piping system 5 has a sufficiently reduced ozone concentration.

The sulfuric acid-containing liquid is supplied from the storage tank 30 to the sulfuric acid-containing liquid nozzle 12 through the downstream supply pipe 32. The temperature of the sulfuric acid-containing liquid is adjusted by the supply side heater 50 when the sulfuric acid-containing liquid flows through the downstream supply pipe 32 (temperature adjustment step). The sulfuric acid-containing liquid may be circulated through the circulation pipe 33. The sulfuric acid-containing liquid is thus circulated through the circulation pipe 33 to thereby pass through the supply heating position 32*b* a plurality of times. Thus, the sulfuric acid-containing liquid is heated by the supply side heater 50 a plurality of times, whereby the temperature of the sulfuric acid-containing liquid is properly adjusted (circulation heating step). When the sulfuric acid-containing liquid thus temperature-adjusted flows toward the sulfuric acid-containing liquid nozzle 12, the ozone gas is mixed in the sulfuric acid-containing liquid in the fluid mixer 60 (ozone gas mixing step).

Unlike in this embodiment, it is also possible to use a mixture liquid (SPM liquid) containing the sulfuric acid-containing liquid and a hydrogen peroxide aqueous solution for the resist removing process. In the resist removing process, hydrogen peroxide in the SPM liquid is decomposed to generate water. In order to reuse the sulfuric acid-containing liquid after the resist removing process, therefore, it is necessary to evaporate the water from the sulfuric acid-containing liquid. However, a complicated equipment may be required for the removal of the water from the SPM liquid.

For this reason, the sulfuric acid-containing liquid containing ozone instead of hydrogen peroxide is used for the resist removing process in this embodiment. Therefore, the sulfuric acid-containing liquid can be reused without the need for the removal of the water.

According to this embodiment, the sulfuric acid-containing liquid used for the resist removing process is heated to the first temperature in at least one of the recovery pipe 4 and the recovery tank 3. Therefore, the ozone contained in the sulfuric acid-containing liquid is released in the form of ozone gas, so that the ozone concentration of the sulfuric acid-containing liquid is reduced.

The sulfuric acid-containing liquid is supplied from the recovery tank 3 to the substrate treatment unit 2 by the supply piping system 5. The ozone gas supplied to the supply piping system 5 from the ozone gas pipe 6 is mixed in the sulfuric acid-containing liquid passing through the supply piping system 5 before the sulfuric acid-containing liquid is supplied to the substrate treatment unit 2. Thus, the ozone gas is dissolved in the sulfuric acid-containing liquid, so that the sulfuric acid-containing liquid to be supplied to the substrate treatment unit 2 has a sufficiently increased ozone concentration.

As described above, ozone is intentionally removed from the sulfuric acid-containing liquid used for the resist removing process and then the ozone gas is dissolved in the resulting sulfuric acid-containing liquid, whereby the sulfuric acid-containing liquid can be reused for the resist removing process. This makes it possible to reuse the sulfuric acid-containing liquid while precisely adjusting the ozone concentration of the sulfuric acid-containing liquid.

According to this embodiment, the temperature of the sulfuric acid-containing liquid passing through the supply piping system 5 is adjusted to the second temperature that is lower than the temperature (first temperature) of the sulfuric acid-containing liquid in the recovery tank 3. That is, the sulfuric acid-containing liquid is heated to the first temperature to sufficiently reduce the ozone concentration of the sulfuric acid-containing liquid, and then the temperature of the sulfuric acid-containing liquid is adjusted to the second temperature. The ozone gas supplied from the ozone gas pipe 6 to the supply piping system 5 is mixed in the sulfuric acid-containing liquid having a sufficiently reduced temperature to be thereby dissolved in the sulfuric acid-containing liquid. Thus, after the ozone is sufficiently removed from the sulfuric acid-containing liquid, the ozone concentration of the sulfuric acid-containing liquid can be increased again. Thereby, the ozone concentration of the sulfuric acid-containing liquid to be supplied from the supply piping system 5 to the substrate treatment unit 2 can be precisely adjusted.

Further, the temperature of the sulfuric acid-containing liquid in the supply piping system 5 is adjusted to the second temperature that is moderately higher than an ordinary temperature (e.g., 25° C.) and, therefore, the resist removing process can be properly performed on the substrate W in the substrate treatment unit 2.

According to this embodiment, the supply side heater 50 (temperature adjustment member) is provided upstream of the ozone gas pipe 6 in the supply piping system 5. Therefore, the temperature of the sulfuric acid-containing liquid is adjusted to the second temperature before the ozone gas supplied from the ozone gas pipe 6 to the supply piping system 5 is mixed in the sulfuric acid-containing liquid. Therefore, the ozone gas supplied to the supply piping system 5 can be speedily dissolved in the sulfuric acid-containing liquid.

According to this embodiment, the sulfuric acid-containing liquid heated both in the recovery pipe 4 and in the recovery tank 3 to thereby have a reduced ozone concentration can be stored in the storage tank 30. The sulfuric acid-containing liquid is supplied from the storage tank 30 toward the substrate treatment unit 2 through the downstream supply pipe 32. Since the ozone gas pipe 6 is connected to the downstream supply pipe 32, the ozone gas is mixed in the sulfuric acid-containing liquid immediately before the sulfuric acid-containing liquid is supplied to the substrate treatment unit 2. Therefore, the reduction in the ozone concentration of the sulfuric acid-containing liquid can be suppressed, which may otherwise occur due to the release of the ozone gas from the sulfuric acid-containing liquid before the sulfuric acid-containing liquid is supplied to the substrate treatment unit 2 after the ozone gas is mixed in the sulfuric acid-containing liquid. Thus, the ozone concentration of the sulfuric acid-containing liquid to be supplied from the supply piping system 5 to the substrate treatment unit 2 can be precisely adjusted.

According to this embodiment, the ozone concentration of the sulfuric acid-containing liquid in the recovery tank 3 is directly or indirectly detected by the ozone concentration meter 25. This makes it possible to determine whether or not the ozone gas is sufficiently removed from the sulfuric acid-containing liquid in the recovery tank 3 by the heating by means of the recovery pipe heater 23 and the recovery tank heater 26.

According to this embodiment, if the ozone concentration is higher than the threshold, the upstream supply valve 35 (switch valve) is closed to prevent the sulfuric acid-containing liquid from flowing into the supply piping system 5 from the recovery tank 3. If the ozone concentration is not higher than the threshold, the upstream supply valve 35 is opened to permit the sulfuric acid-containing liquid to flow into the supply piping system 5. Therefore, the sulfuric acid-containing liquid is automatically allowed to flow into the supply piping system 5 only when having an ozone concentration not higher than the threshold. Thus, the ozone concentration of the sulfuric acid-containing liquid can be more precisely adjusted in the supply piping system 5.

<Change in Surface Structure of Substrate Due to Resist Removing Process>

Next, a change in the surface structure of the substrate W due to the resist removing process will be described.

Figure 4A:
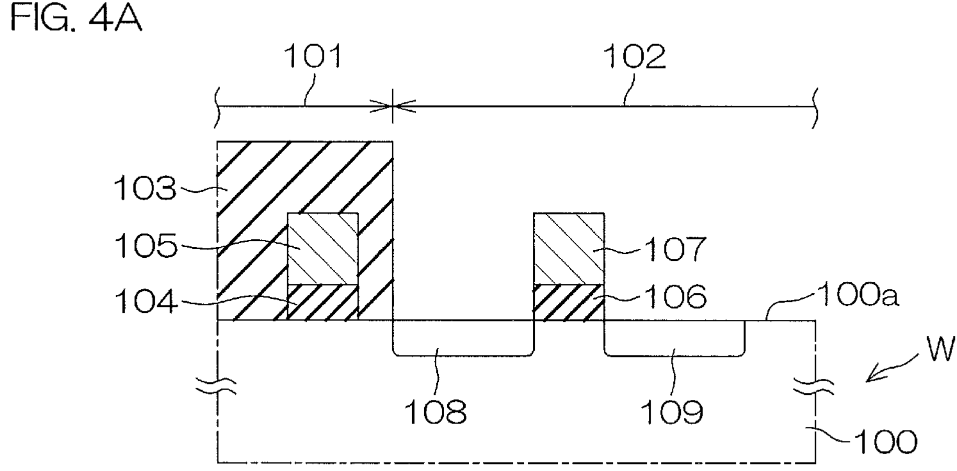
FIG. 4A is a schematic sectional view for describing the surface structure of a substrate yet to be subjected to a resist removing process with the use of a sulfuric acid-containing liquid containing ozone dissolved therein.
Figure 4B:
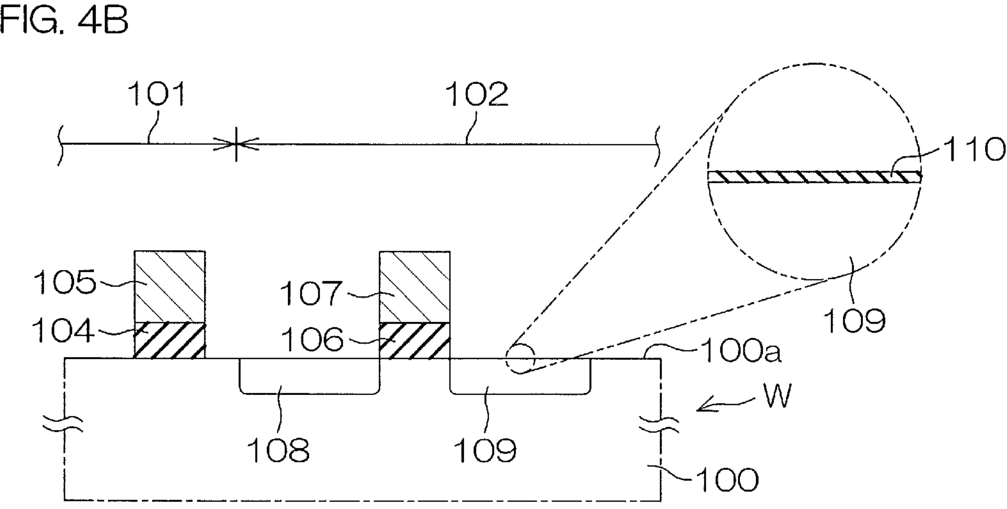
FIG. 4B is a schematic sectional view for describing the surface structure of a substrate subjected to the resist removing process with the use of the sulfuric acid-containing liquid containing ozone dissolved therein.

FIG. 4A is a schematic sectional view for describing the surface structure of a substrate W yet to be subjected to the resist removing process with the use of the sulfuric acid-containing liquid. FIG. 4B is a schematic sectional view for describing the surface structure of a substrate W having been subjected to the resist removing process with the use of the sulfuric acid-containing liquid.

Referring to FIG. 4A, the substrate W to be subjected to the resist removing process includes, for example, a silicon layer 100 having a major surface 100*a*. The major surface 100*a* of the silicon layer 100 has a protection region 101 and a non-protection region 102. The substrate W has a resist layer 103 formed on the protection region 101 of the major surface 100*a* of the silicon layer 100, a first silicon oxide layer 104 formed on the protection region 101 of the major surface 100*a*, a first polysilicon layer 105 formed on the first silicon oxide layer 104, a second silicon oxide layer 106 formed on the non-protection region 102 of the major surface 100*a*, and a second polysilicon layer 107 formed on the second silicon oxide layer 106. The resist layer 103 covers the first silicon oxide layer 104 and the first polysilicon layer 105. The substrate W includes a first impurity region 108 of a first conductivity type (e.g., n-type) formed in a surface portion of the major surface 100*a* of the silicon layer 100 in the non-protection region 102, and a second impurity region 109 of the first conductivity type formed in a surface portion of the major surface 100*a* of the silicon layer 100 in spaced relation from the first impurity region 108 in the non-protection region 102.

The second polysilicon layer 107 and the second silicon oxide layer 106 may constitute a planar gate structure provided in opposed relation to a channel region of a second conductivity type (e.g., p-type) defined between the first impurity region 108 and the second impurity region 109 on the major surface 100*a* of the silicon layer 100. In this case, the first impurity region 108 and the second impurity region 109 function as a drain region and a source region, respectively.

By performing the resist removing process with the use of the sulfuric acid-containing liquid, the resist layer 103 is removed from the substrate W as shown in FIG. 4B. If the ozone concentration of the sulfuric acid-containing liquid is excessively high, the surface portion of the silicon layer 100 in the non-protection region 102 is oxidized. Therefore, the surface portions of the first impurity region 108 and the second impurity region 109 are also oxidized to be formed with oxide films 110. The oxide films 110 are removed by a process subsequent to the resist removing process. This increases distances between the second polysilicon layer 107 as the gate and the surfaces of the first impurity region 108 and the second impurity region 109, and reduces the impurity concentrations of the first impurity region 108 and the second impurity region 109. This may result in a device failure. Specifically, drain current is liable to be reduced.

Where the sulfuric acid-containing liquid prepared by intentionally removing ozone from the sulfuric acid-containing liquid used for the resist removing process of the substrate W and then dissolving the ozone gas in the resulting sulfuric acid-containing liquid is reused for the resist removing process, the unintended oxidation of the surface portions of the silicon layer 100 (the first impurity region 108 and the second impurity region 109) can be suppressed.

<Modifications of Substrate Treatment Apparatus>

FIGS. 5 to 10 are schematic diagrams for describing first to sixth modifications, respectively, of the substrate treatment apparatus 1.

Figure 5:
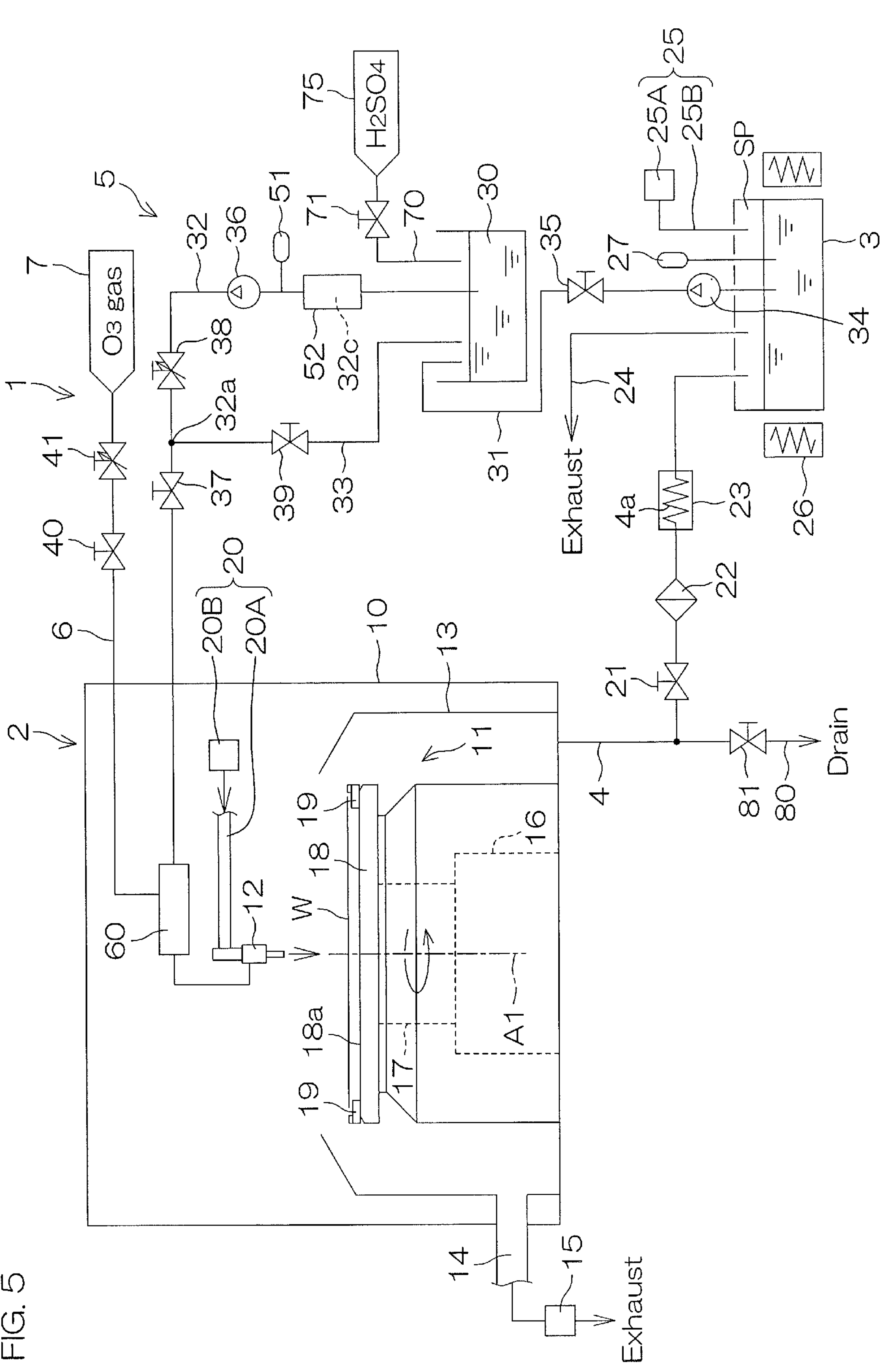
FIG. 5 is a schematic diagram for describing a first modification of the substrate treatment apparatus.

As shown in FIG. 5, a substrate treatment apparatus 1 according to the first modification includes, instead of the supply side heater 50, a supply side cooler 52 that cools the sulfuric acid-containing liquid in the supply piping system 5. The supply side cooler 52 is not necessarily required to be constantly on, but may be switched between a cooling state and a non-cooling state based on the temperature measured by the supply side thermometer 51. Since the second temperature is lower than the first temperature, the temperature of the sulfuric acid-containing liquid in the supply piping system 5 can be easily reduced to be adjusted to the second temperature by switching the supply side cooler 52 from the non-cooling state to the cooling state.

In this embodiment, the supply side cooler 52 cools the sulfuric acid-containing liquid in the downstream supply pipe 32. A position (supply cooling position 32*c*) at which the liquid is cooled by the supply side cooler 52 in the downstream supply pipe 32 is located upstream of the upstream supply pump 36 in the downstream supply pipe 32.

Unlike in this embodiment, the supply side cooler 52 may be a cooler adapted to be immersed in the sulfuric acid-containing liquid in the storage tank 30 to cool the sulfuric acid-containing liquid in the storage tank 30, or may be a cooler attached to at least one of the outer surface of the side wall or the lower surface of the bottom wall of the storage tank 30. The supply side cooler 52 may be a cooler adapted to cool the sulfuric acid-containing liquid in the circulation pipe 33. The supply side cooler 52 may include any combination of these coolers as the temperature adjustment member.

Unlike in the first modification, the supply side heater 50 and the supply side cooler 52 may be provided in combination.

Figure 6:
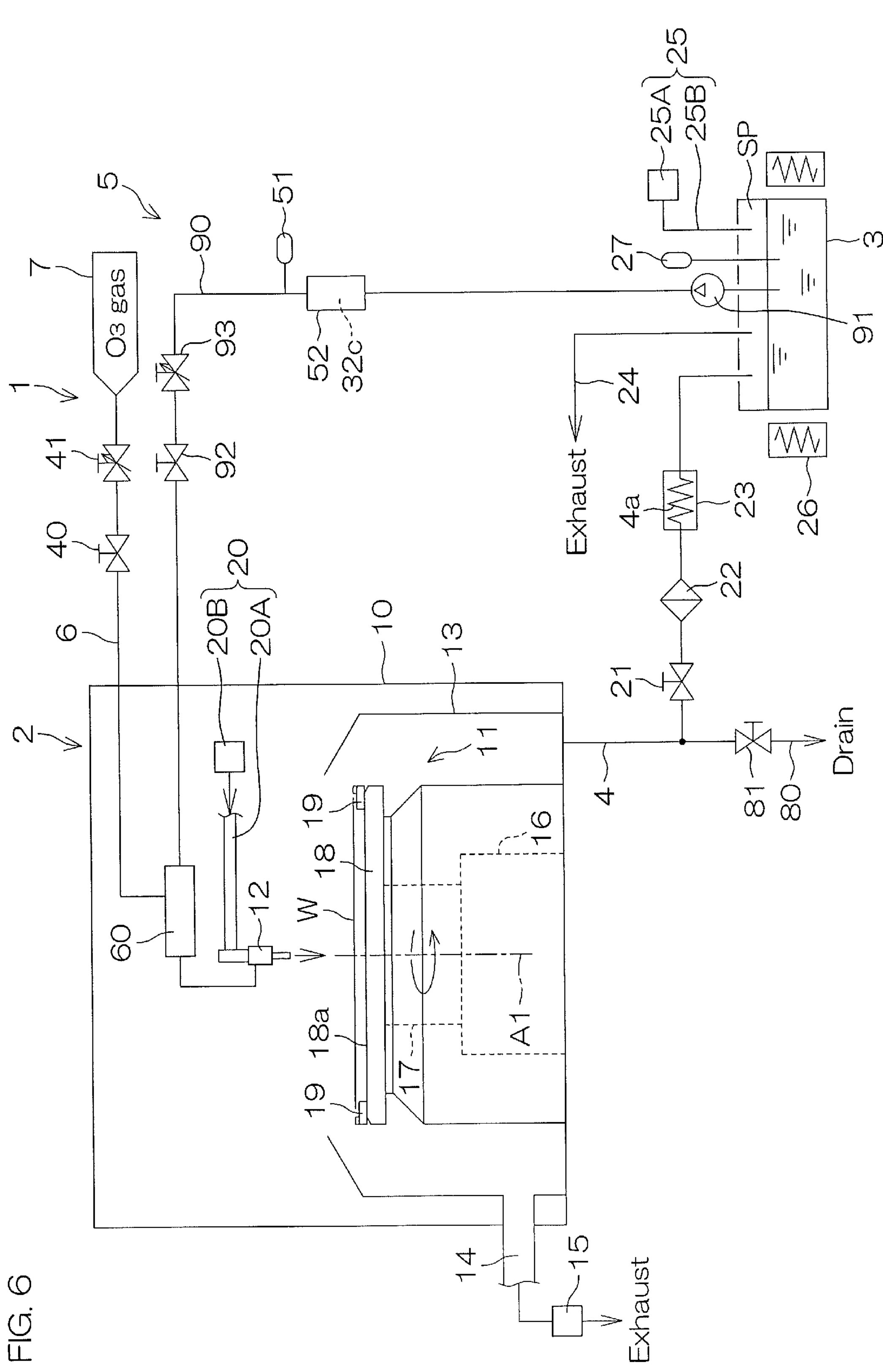
FIG. 6 is a schematic diagram for describing a second modification of the substrate treatment apparatus.

In a substrate treatment apparatus 1 according to the second modification, as shown in FIG. 6, the supply piping system 5 includes neither the storage tank 30 nor the circulation pipe 33, but includes a supply pipe 90 unitarily including the upstream supply pipe 31 and the downstream supply pipe 32. The supply pipe 90 supplies the sulfuric acid-containing liquid from the recovery tank 3 to the substrate treatment unit 2. The substrate treatment apparatus 1 according to the second modification further includes: a liquid feeding upstream supply pump 91 that feeds the sulfuric acid-containing liquid from the recovery tank 3 to the supply pipe 90; a supply side cooler 52 that cools the sulfuric acid-containing liquid in the supply pipe 90; a supply side thermometer 51 that measures the temperature of the sulfuric acid-containing liquid in the supply piping system 5; a supply valve 92 that opens and closes the supply pipe 90; and a supply flow rate adjustment valve 93 that adjusts the flow rate of the sulfuric acid-containing liquid in the supply pipe 90. In the second modification, the supply valve 92 functions as the switch valve that switches on and off the supply of the sulfuric acid-containing liquid to the supply piping system 5.

Figure 7:
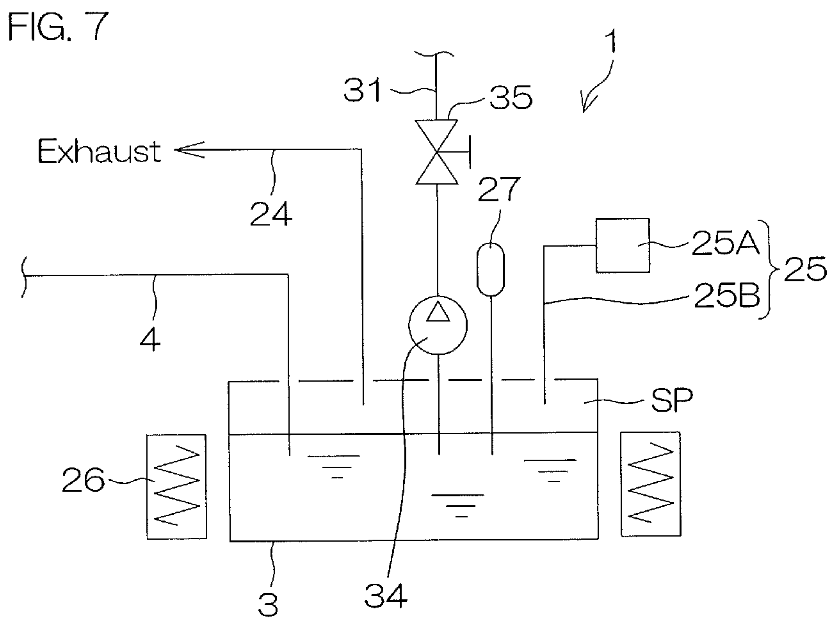
FIG. 7 is a schematic diagram for describing a third modification of the substrate treatment apparatus.
Figure 8:
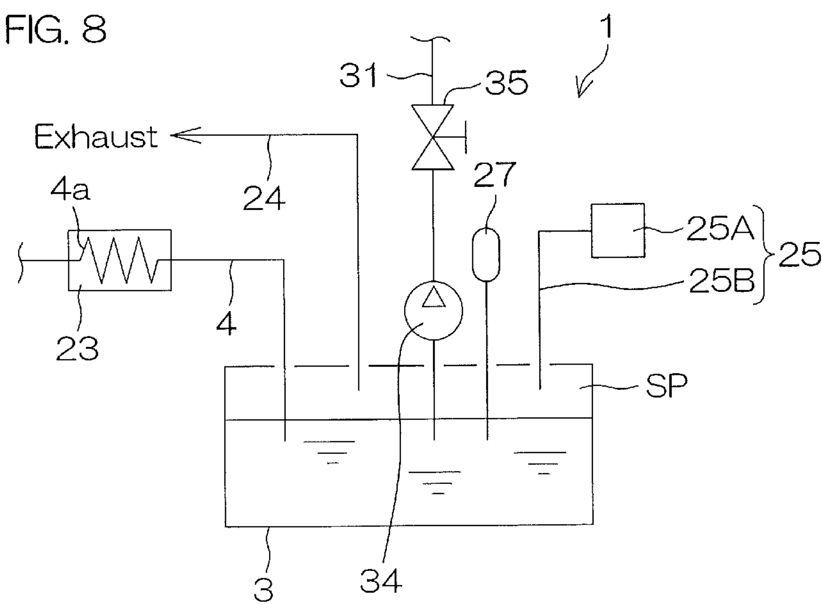
FIG. 8 is a schematic diagram for describing a fourth modification of the substrate treatment apparatus.

In a substrate treatment apparatus 1 according to the third modification, as shown in FIG. 7, the recovery pipe heater 23 is not provided, but the recovery tank heater 26 is provided as the recovery side heater. In a substrate treatment apparatus 1 according to the fourth modification, as shown in FIG. 8, the recovery tank heater 26 is not provided, but the recovery pipe heater 23 is provided as the recovery side heater. Thus, at least one of the recovery pipe heater 23 (heating member) that heats the sulfuric acid-containing liquid to the first temperature in the recovery pipe 4 and the recovery tank heater 26 (heating member) that heats the sulfuric acid-containing liquid to the first temperature in the recovery tank 3 may be provided. Similarly, at least one of the sulfuric acid-containing liquid in the recovery tank 3 and the sulfuric acid-containing liquid passing through the recovery pipe 4 may be heated to the first temperature in the heating step of the resist removing process.

Figure 9:
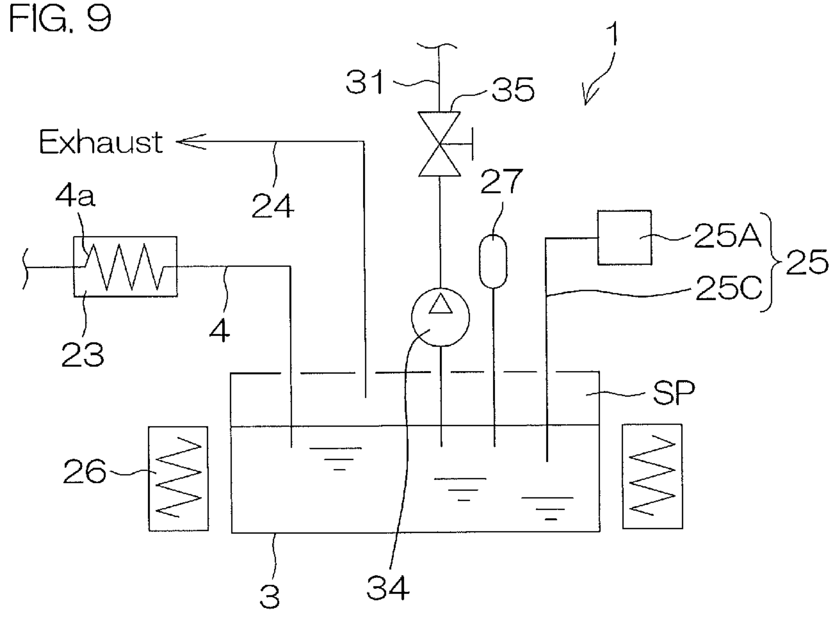
FIG. 9 is a schematic diagram for describing a fifth modification of the substrate treatment apparatus.

In a substrate treatment apparatus 1 according to the fifth modification, as shown in FIG. 9, the ozone concentration meter 25 is configured to measure the ozone concentration of the sulfuric acid-containing liquid in the recovery tank 3. In the fifth modification, the ozone concentration meter 25 includes a meter body 25A, and a liquid supply pipe 25C that has a distal end located below the liquid surface of the sulfuric acid-containing liquid in the recovery tank 3 and supplies the sulfuric acid-containing liquid from the recovery tank 3 to the meter body 25A.

Figure 10:
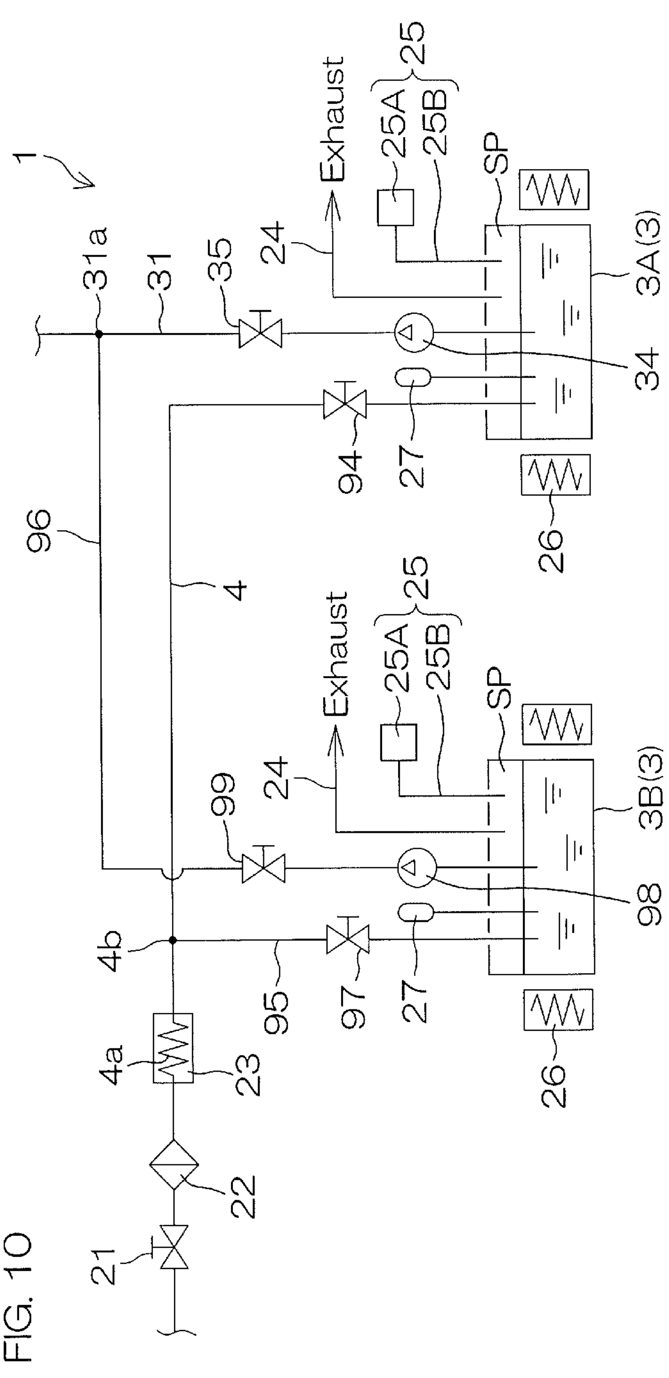
FIG. 10 is a schematic diagram for describing a sixth modification of the substrate treatment apparatus.

In a substrate treatment apparatus 1 according to the sixth modification, as shown in FIG. 10, a plurality of recovery tanks 3 (two recovery tanks 3 in this embodiment) are disposed in juxtaposition.

The recovery tanks 3 include a first recovery tank 3A and a second recovery tank 3B. The first recovery tank 3A and the second recovery tank 3B have the same structure. That is, the first recovery tank 3A and the second recovery tank 3B each include an exhaust pipe 24, an ozone concentration meter 25, a recovery tank heater 26, and a recovery side thermometer 27.

The upstream end of the recovery pipe 4 is connected to the treatment cup 13 (see FIG. 1) of the substrate treatment unit 2, and the downstream end of the recovery pipe 4 is connected to the first recovery tank 3A. The upstream end of the upstream supply pipe 31 is connected to the first recovery tank 3A, and the downstream end of the upstream supply pipe 31 is connected to the storage tank 30 (see FIG. 1).

The substrate treatment apparatus 1 according to the sixth modification further includes: a downstream recovery valve 94 that opens and closes the recovery pipe 4 downstream of the recovery valve 21; a branch recovery pipe 95 branched from the recovery pipe 4 and connected to the second recovery tank 3B; and a branch supply pipe 96 branched from the upstream supply pipe 31 and connected to the second recovery tank 3B.

The downstream recovery valve 94 is provided downstream of the recovery pipe heater 23 in the recovery pipe 4. A branch position 4*b* at which the branch recovery pipe 95 is connected to the recovery pipe 4 is located downstream of the recovery pipe heater 23 and upstream of the downstream recovery valve 94. A branch position 31*a* at which the branch supply pipe 96 is connected to the upstream supply pipe 31 is located downstream of the upstream supply valve 35.

The substrate treatment apparatus 1 according to the sixth modification includes: a branch recovery valve 97 that opens and closes the branch recovery pipe 95; a branch liquid feed pump 98 that feeds the sulfuric acid-containing liquid from the second recovery tank 3B to the branch supply pipe 96; and a branch supply valve 99 that opens and closes the branch supply pipe 96. The branch recovery valve 97 is provided in the branch recovery pipe 95. The branch liquid feed pump 98 is provided in the branch supply pipe 96, and the branch supply valve 99 is provided downstream of the branch liquid feed pump 98 in the branch supply pipe 96.

In the substrate treatment apparatus 1 including the plural recovery tanks 3 (e.g., the two recovery tanks 3) disposed in juxtaposition, the sulfuric acid-containing liquid can be fed toward the storage tank 30, if the ozone concentration of the sulfuric acid-containing liquid is sufficiently reduced in at least one of the two recovery tanks 3.

<Treatment with Liquid Other than Sulfuric Acid-Containing Liquid>

The treatment liquid to be supplied to the upper surface of the substrate W is not limited to the sulfuric acid-containing liquid, but may be ammonia water or hydrofluoric acid (hydrogen fluoride water). An ammonia water/ozone mixture liquid (AOM liquid) suitable for a cleaning process can be prepared by dissolving ozone gas in ammonia water. A hydrofluoric acid/ozone mixture liquid (FOM liquid) suitable for a cleaning process to be performed after dry etching can be prepared by dissolving ozone gas in hydrofluoric acid.

Figure 11A:
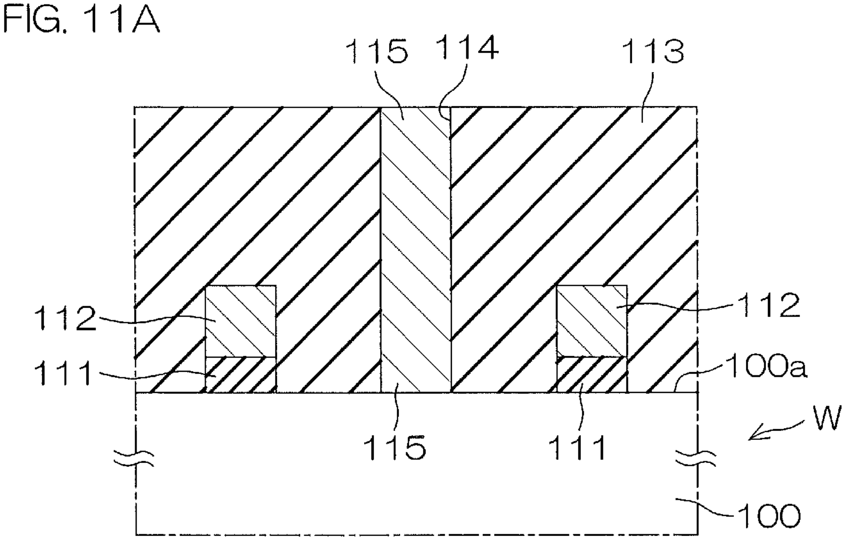
FIG. 11A is a schematic sectional view for describing the surface structure of a substrate yet to be subjected to a cleaning process with the use of ammonia water containing ozone dissolved therein.
Figure 11B:
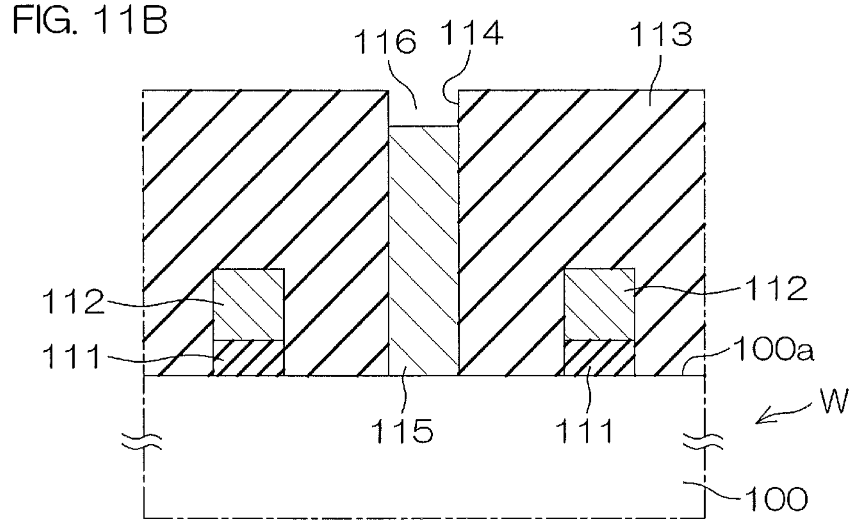
FIG. 11B is a schematic sectional view for describing the surface structure of a substrate subjected to the cleaning process with the use of the ammonia water containing ozone dissolved therein.

FIG. 11A is a schematic sectional view for describing the surface structure of a substrate W yet to be subjected to the cleaning process with the use of ammonia water containing ozone dissolved therein. FIG. 11B is a schematic sectional view for describing the surface structure of a substrate W having been subjected to the cleaning process with the use of the ammonia water containing ozone dissolved therein.

Referring to FIG. 11A, the substrate W to be subjected to the cleaning process with the use of the ammonia water containing ozone dissolved therein includes, for example, a silicon layer 100 having a major surface 100*a*, a silicon oxide layer 111 formed on the major surface 100*a*, a polysilicon layer 112 formed on the silicon oxide layer 111, an interlevel dielectric film 113 formed over the major surface 100*a* to cover the silicon oxide layer 111 and the polysilicon layer 112, and a contact electrode 115 buried in a contact hole 114 formed in the interlevel dielectric film 113. The interlevel dielectric film 113 is formed, for example, of at least one of silicon oxide and silicon nitride. The contact electrode 115 is formed, for example, of a metal such as tungsten.

The cleaning process is performed with the use of the ammonia water containing ozone dissolved therein, whereby foreign matter is washed away from the surface of the interlevel dielectric film 113. If the ozone concentration of the ammonia water is excessively high, a part of the contact electrode 115 exposed from the interlevel dielectric film 113 is etched as shown in FIG. 11B. The surface of the contact electrode 115 is liable to be recessed by the etching, whereby an unintended recess 116 is formed. The formation of the recess 116 may result in a device failure.

Where ozone is intentionally removed from the ammonia water used for the cleaning process of the substrate W and then the ozone gas is dissolved in the resulting ammonia water, the ammonia water can be reused for the cleaning process. This makes it possible to suppress the unintended formation of the recess 116 on the major surface of the substrate W.

Figure 12A:
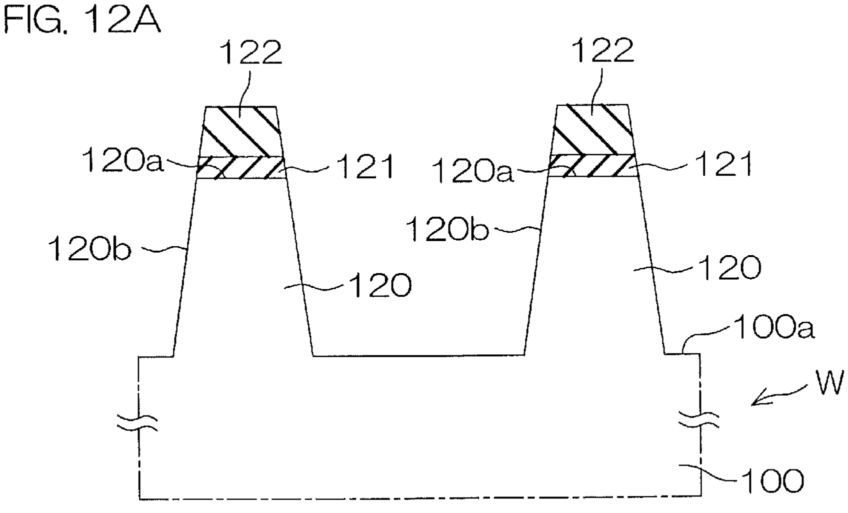
FIG. 12A is a schematic sectional view for describing the surface structure of a substrate yet to be subjected to a cleaning process with the use of hydrofluoric acid containing ozone dissolved therein.
Figure 12B:
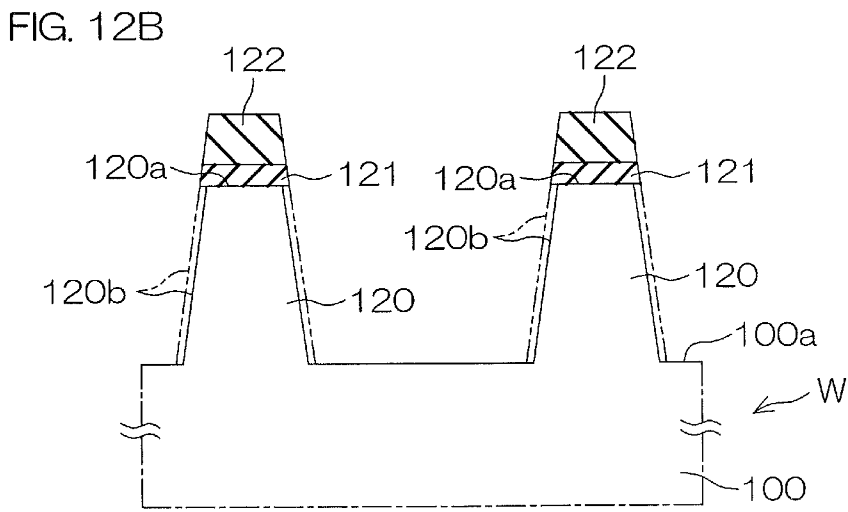
FIG. 12B is a schematic sectional view for describing the surface structure of a substrate subjected to the cleaning process with the use of the hydrofluoric acid containing ozone dissolved therein.

FIG. 12A is a schematic sectional view for describing the surface structure of a substrate W yet to be subjected to the cleaning process with the use of the hydrofluoric acid containing ozone dissolved therein. FIG. 12B is a schematic sectional view for describing the surface structure of a substrate W having been subjected to the cleaning process with the use of the hydrofluoric acid containing ozone dissolved therein.

Referring to FIG. 12A, the substrate W to be subjected to the cleaning process with the use of the hydrofluoric acid containing ozone dissolved therein is, for example, a substrate W obtained after an interlevel dielectric film is removed by dry etching. Specifically, the substrate W to be subjected to the cleaning process with the use of the hydrofluoric acid containing ozone dissolved therein includes a silicon layer 100 having a major surface 100*a*, a projection 120 projecting from the major surface 100*a* of the silicon layer 100, a pad oxide layer 121 formed on the top 120*a* of the projection 120, and a nitride layer 122 formed on the pad oxide layer 121. The projection 120 is formed of silicon.

By performing the cleaning process with the use of the hydrofluoric acid containing ozone dissolved therein, a damage occurring due to the dry etching is eliminated. If the ozone concentration of the hydrofluoric acid containing ozone dissolved therein is excessively high, the side walls 120*b* of the projection 120 is etched as shown in FIG. 12B. Therefore, the projection 120 is liable to have a reduced width due to the etching, resulting in a device failure. Where ozone is intentionally removed from the hydrofluoric acid used for the cleaning process of the substrate W and then the ozone gas is dissolved in the resulting hydrofluoric acid, the hydrofluoric acid can be reused for the cleaning process. This makes it possible to suppress the unintended etching of the projection 120 on the major surface of the substrate W.

OTHER EMBODIMENTS

The present invention is not limited to the embodiment described above, but may be embodied in some other ways.

In the embodiment shown in FIG. 1, for example, the circulation valve 39 may be provided upstream of the circulation connection position 32*a* in the downstream supply pipe 32.

In the embodiment described above, the ozone gas and the sulfuric acid-containing liquid are mixed together by means of the fluid mixer 60. Unlike in the embodiment described above, a bubbling mechanism that bubbles the sulfuric acid-containing liquid with the ozone gas in a storage tank to dissolve the ozone gas in the sulfuric acid-containing liquid may be provided instead of the fluid mixer 60. In this case, the ozone gas pipe 6 is connected to the downstream supply pipe 32 not via the fluid mixer 60.

In the embodiment described above, the supply heating position 32*b* (see FIG. 1) is located upstream of the connection position of the ozone gas pipe 6 (fluid mixer 60) in the downstream supply pipe 32. Alternatively, the supply heating position 32*b* may be located downstream of the fluid mixer 60 in the downstream supply pipe 32.

In the embodiment described above, the controller 8 closes the upstream supply valve 35 if the concentration detected by the ozone concentration meter 25 is higher than the predetermined threshold, and opens the upstream supply valve 35 if the concentration detected by the ozone concentration meter 25 is not higher than the predetermined threshold. Alternatively, the controller 8 may control the upstream supply valve 35 to open the upstream supply valve 35 if the detected concentration is 0 ppm, and to close the upstream supply valve 35 if the detected concentration is higher than 0 ppm.

In the embodiment described above, the substrate treatment apparatus 1 is of single substrate treatment type adapted to treat a single substrate W at a time. Alternatively, the substrate treatment apparatus 1 may be of immersion treatment type adapted to treat a plurality of substrates W by immersing the substrates W in a treatment liquid stored in an immersion tank.

In the embodiment described above, expressions "horizontal" and "vertical" are used, but do not strictly mean "horizontal" and "vertical." That is, these expressions permit deviations in production accuracy, installation accuracy and the like.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2021-52417 filed in the Japan Patent Office on Mar. 25, 2021, the disclosure of which is entirely incorporated herein by reference.

REFERENCE SIGNS LIST

1: Substrate treatment apparatus
2: Substrate treatment unit
3: Recovery tank
3A: First recovery tank
3B: Second recovery tank
4: Recovery pipe
5: Supply piping system
6: Ozone gas pipe
8: Controller
23: Recovery pipe heater (heating member)
25: Ozone concentration meter
26: Recovery tank heater (heating member)
30: Storage tank
31: Upstream supply pipe
32: Downstream supply pipe
35: Upstream supply valve (switch valve)

50: Supply side heater (temperature adjustment member)
52: Supply side cooler (temperature adjustment member)
60: Fluid mixer
92: Supply valve (switch valve)
100: Silicon layer
100*a*: Major surface
101: Protection region
103: Resist layer
SP: Inside space
W: Substrate

The invention claimed is:

1. A substrate treatment apparatus comprising:

a substrate treatment unit that treats a substrate with a treatment liquid containing ozone dissolved therein;

a recovery tank in which the treatment liquid discharged from the substrate treatment unit is recovered;

a recovery pipe that connects the substrate treatment unit to the recovery tank;

a heater that heats the treatment liquid to a first temperature in at least one of the recovery pipe and the recovery tank;

a supply piping system that supplies the treatment liquid from the recovery tank to the substrate treatment unit;

an ozone gas pipe that supplies ozone gas to the supply piping system to mix the ozone gas in the treatment liquid passing through the supply piping system;

an ozone concentration meter that detects an ozone concentration of the treatment liquid in the recovery tank or an ozone concentration in a space contacting a liquid surface of the treatment liquid in the recovery tank;

a switch valve that switches on and off flow of the treatment liquid from the recovery tank to the supply piping system; and a controller that controls the switch valve based on a detection result of the ozone concentration meter;

wherein the controller opens the switch valve if the concentration detected by the ozone concentration meter is not higher than a predetermined threshold, and closes the switch valve if the detected concentration is higher than the predetermined threshold.

* * * * *